United States Patent [19]

Yoshino et al.

[11] Patent Number: 5,118,642
[45] Date of Patent: Jun. 2, 1992

[54] METHOD FOR PRODUCING SEMICONDUCTORS

[75] Inventors: Akira Yoshino; Kenji Okumura; Yoshinori Ohmori; Toshiharu Ohnishi, all of Osaka, Japan

[73] Assignee: Daidousanso Co., Ltd., Osaka, Japan

[21] Appl. No.: 645,441

[22] Filed: Jan. 24, 1991

[51] Int. Cl.$^5$ .................. H01L 21/00; H01L 21/02; C23C 16/46
[52] U.S. Cl. ................... 437/225; 437/228; 437/233; 437/234; 148/DIG. 56; 118/50; 118/715; 118/724; 118/733; 427/69; 427/70; 427/248.1
[58] Field of Search ............... 437/105, 107, 225, 228, 437/233, 234, 967; 148/DIG. 56, DIG. 122; 118/50, 715, 724, 733; 427/69, 70, 248.1

[56] References Cited

U.S. PATENT DOCUMENTS

| | | |
|---|---|---|
| 3,916,822 | 11/1975 | Robinson . |
| 4,369,031 | 1/1983 | Goldman et al. .................. 118/724 |
| 4,979,465 | 12/1990 | Yoshino et al. .................. 118/715 |
| 4,989,540 | 2/1991 | Fuse et al. .................. 118/724 |
| 5,029,554 | 7/1991 | Mujashita et al. .................. 118/715 |

FOREIGN PATENT DOCUMENTS

| | | |
|---|---|---|
| 0104117 | 6/1984 | Japan . |
| 2093071 | 4/1990 | Japan .................. 118/715 |

OTHER PUBLICATIONS

Patent Abstracts of Japan, vol. 8, No. 221 (E-271)[1658], 1st Oct. 1984; JP-A-59 104 117 (Kogyo Gijutsuin Japan) 15-06-1984.

Primary Examiner—Brian E. Hearn
Assistant Examiner—B. Everhart
Attorney, Agent, or Firm—Armstrong & Kubovcik

[57] ABSTRACT

A reactant gas is fed to a dispersing chamber which is disposed under a reaction chamber, and both disposed within a vacuum chamber. The reactant gas is dispersed and then fed through a plurality of communicating holes to the reaction chamber. A second reactant gas is fed to a lower dispersing chamber. After dispersion, this second gas is fed through pipes through the first dispersing chamber and into the reaction chamber around the first reaction gas. Said first reactant gas is blown off downward from the end opening of the feeding pipe and dispersed in parallel along the collar portion and dispersed homogeneously in the first reactant gas dispersing chamber, and in the state, is introduced to the reaction chamber via communicating holes.

6 Claims, 7 Drawing Sheets

METHOD FOR PRODUCING SEMICONDUCTORS

FIELD OF THE INVENTION

This invention relate to an apparatus for producing semiconductors wherein compound semiconductor layers are grown in a vacuum chemical epitaxy (VCE) system.

BACKGROUND OF THE INVENTION

In recent years, the demand for compound semiconductors especially Group III-V compounds (e.g. GaAs) has been growing because of their being superior in performance characteristics to the conventional silicon semiconductors. For the production of such Group III-V compound semiconductors, there are known, among others, the so-called molecular beam epitaxy (MBE) process which comprises causing atoms required for a compound to be epitaxially grown to evaporate from a solid material using a heat gun and causing them to collide, in the molecular beam form, against a substrate in an ultrahigh vacuum to thereby cause growth of a film of said material on said substrate, and the so-called metal organic chemical vapor deposition (MOCVD) process which comprises introducing the vapor of methyl-metal or ethyl-metal compound into a reaction chamber at atmospheric pressure or under reduced pressure by means of a carrier gas such as $H_2$, allowing said vapor to mix with a Group V metal hydride and allowing the reaction therebetween to take place on a heated substrate for crystal growth.

However, the MBE process among said two processes is not suited for a large-scale production, hence can hardly meet the needs of the market because ① it requires $10^{-11}$ Torr order of ultra-high vacuum, ② downtime generates when refilling materil and ③ it requires a substrate rotating mechanism in order to conduct a homogeneous growth. Therefore, MOCVD process is now paid attention and practically used. However, it has disadvantages in that ① a distribution is easily caused in a flow direction and it is difficult to analyze the flow at a scale-up since it is a process in a laminar flow area and ② reactant gas is expensive and its utilization efficiency of the reactant gas is low because of the growth mechanism. Since a large quantity of unreacted gas, which is toxic, is produced because of the efficiency of reactant gas utilization being low, as mentioned above, since a carrier gas constitutes an additional waste gas portion, a large quantity of a toxic waste gas is discharged n large quantities, and this fact leads to waste gas disposal problems.

Thus, MBE process and MOCVD process have disadvantages respectively, it is desired to provide an apparatus for producing semiconductors removed these disadvantages completely. Accordingly, the inventors succeeded in developing an apparatus for producing semiconductors which advantages of both MBE and MOCVD process are incorporated and filed a patent application (Japanese patent application No. 63-191060). The structure of this apparatus is shown in FIGS. 5 and 6. In these figures, the reference numeral 101 indicates the vacuum chamber of vacuum chemical epitaxy, the vacuum chamber 101 has a reaction chamber 102 therein, which is formed by a base plate 106, surrounding walls 107 and a top place 108 placed, slidably in one direction, on the upper edges of the surrounding walls 107. The top plate has, in the middle portion thereof, openings 108a. Disc-form GaAs substrates 113 are detachably mounted on the openings 108a respectively. The surrounding walls of the reaction chamber 102 have exhaust ports 110 at certain given intervals around the same. The total area of these exhaust ports 110 is preferably about 4% of the surface area of the top plate 108 of the reaction chamber 102. The base plate 106 has nozzle openings 109 formed at predetermined intervals therein, which is in communication with openings 109 or 134 in the ceiling of a first dispersing chamber 104 disposed under the reaction chamber 102. Each opening 109 is in communication with the first dispersing chamber 104, whereas each opening 134 is in communication with a second dispersing chamber 124 via a duct 119 which passes through the first dispersing chamber 104. The first dispersing chamber 104 is in communication with a starting material inlet tube 121. Said starting material inlet tube 121 serves for introducing into the first dispersing chamber 104 of a Group III compound (reactant gas) such as trimethylgallium (TMGa) or triethylgallium (TEGa). The second dispersing chamber 124 has an opening in the lower part, and an exhaust valve 136, suitably a poppet valve, is disposed displaceably in said opening for opening or closing said opening. Said second dispersing chamber 124 is in communication, through one side wall thereof, with a starting material inlet tube 121. Through said inlet tube 121, an n-type or p-type dopant or a Group III compound such as triethylaluminum (TEAl) enters the second dispersing chamber 124. A feeding tube 142 for feeding a Group V compound such as $AsH_3$ to the reaction chamber 102 has a plurality of holes 142a and 142b at certain definite intervals and in two rows (right and left). A heater 105 is disposed above the top plate 108 of the reaction chamber 102, with a leveling plate 105c. In this apparatus for MESFET epitaxy layer growth, the reaction chamber 10 is fitted with the substrates 113 (the surfaces face below respectively) thereon, then, the vacuum chamber 101 is evacuated to a vacuum of less than $10^{-7}$ Torr and the heater 105 is electrically loaded so that the heater 105 can generate heat. A Group V compound, such as $AsH_3$ is fed to the feeding tube 142 with the substrate temperature 500° C., so that it enters the reaction chamber 102 through the holes 142a and 142 b. The Group V compound thus fed to the reaction chamber 102 flows toward the exhaust ports 110 across the surfaces of the substrates 113. During the flow, $AsH_3$ or TEAs is collided against the walls of the reaction chamber which are hot walls many times and thermally cracked to give $As_2$. After temperature of the substrates reached predetermined process temperature (600°~650° C.), a Group III compound such as triethylgallium (TEGa) is supplied into the first dispersing chamber 104 from the starting material tube 121 of the reaction chamber 102, is mixed homogeneously and then is blown toward the substrates 113 from nozzles 109 in a homogeneous molecular density. At this time, since the mean free path of molecules of the Group III compound is set longer than the distance from orifice to wafer, the molecules of the Group III compound reaches substrates without having dispersion by collision between material molecules, The molecule of the Group III compound, together with $As_2$, come into contact with the surface of the substrates 113 and grows on said surface in the form of an undoped gallium arsenide (GaAs) layer or the like. The unconsumed compound that has not come into contact with the substrates 113 leave the reaction chamber via the exhaust ports 110 and enters the vacuum chamber 101. which they then leave laterally under the action of an exhaustion means. Then, an n-type dopant, either alone or in admixture with the above-mentioned Group III or V compound, is fed to the reaction chamber 102 from the second dispersing chamber 124 so that an n-type active layer can grow on the surface of said undoped GaAs layer. Thereafter, all the gas supplies are discontinued and the system is maintained as it is for about 15 minutes. Then, the substrates 113 are cooled and then taken out of the reaction chamber 102 (hence, from the vacuum chamber 101). In this way, Group III-V compound semiconductors layer can be obtained.

However, in the apparatus for producing semiconductors with said structure, when growth of substrate with large area or a plurality of substrates is conducted, that is, when the distance between a supplying tube and exhaust ports becomes long, there is a disadvantage that distribution of molecular density of Group V compound is caused between a supplying tube of Group V compound such as AsH$_3$ and the exhaust ports and thereby to be difficult to form an homogeneous semiconductor layer in some case (when the layer grows at low V/III ratio). As shown in FIG. 7, since peripheral part of the substrates 113 are supported by substrate holding part comprising a supporting part 108b along the whole circumference, molecular beams which go upward as an arrow mark from the lower part of the reaction chamber 102 are obstructed by said supporting part 108b not to reach the peripheral part of the substrates 113. Therefore, the peripheral parts of substrates 113, as shown in FIG. 8, are left as untreated part to be uneconomical.

Accordingly, it is an object to provide an apparatus for producing semiconductors which can distribute all the reactant gas into the reaction chamber in a homogeneous state.

SUMMARY OF THE INVENTION

The present invention provides a modified semiconductor production apparatus provided with a vacuum chamber, a reaction chamber disposed within said vacuum chamber, substrate means disposed at a ceiling portion of said reaction chamber so as to hold the substrates in a state the substrates contact a reacting space, a substrate heating means disposed at the upper part of said reaction chamber for heating said substrates, a reactant gas dispersing chamber disposed under said reaction chamber, a plurality of communication holes disposed at the border part between said reactant gas dispersing chamber and reaction chamber at predetermined intervals on the whole surface to communicate the two chambers, a first reactant gas feeding pipe of which one end extends into said reactant gas dispersing chamber and the end opening opens toward the bottom surface of reactant gas dispersing chamber, a collar portion disposed in parallel at the peripheral portion of said end opening of said first reactant gas feeding pipe, a second dispersing chamber disposed under said reactant ga dispersing chamber, a plurality of communicating pipes extended from the ceiling portion of said second dispersing chamber into said each communicating hole of said reactant gas dispersing chamber respectively so that a clearance can be made between itself and the hole wall, and a second reactant gas feeding pipe for supplying second reactant gas to said second dispersing chamber.

In the accompanying drawings,

FIG. 1(A) illustrates, in sectional view, the constitution of an embodiment according to the present invention, FIG. 1(B) illustrates, in plan view, the substrate holding part thereof, FIG. 1(C) illustrates, in enlarged plan view, the heater thereof, FIG. 2 illustrate, in vertical section of the substrate holding part thereof, FIG 3 illustrates, in plan view, an arrangement state thereof, FIG. 4 illustrates, in sectional view, a constitution of another embodiment of the present invention, FIG. 5 illustrates, in sectional view, an apparatus which is a basis of the present invention, FIG. 6 illustrates, in enlarged view, a main part thereof, FIG. 7 illustrates, in sectional view, a substrate holding part thereof, and FIG. 8 illustrates, in plan view, a holding state thereof.

DETAILED DESCRIPTION OF THE INVENTION

Figure 1A:
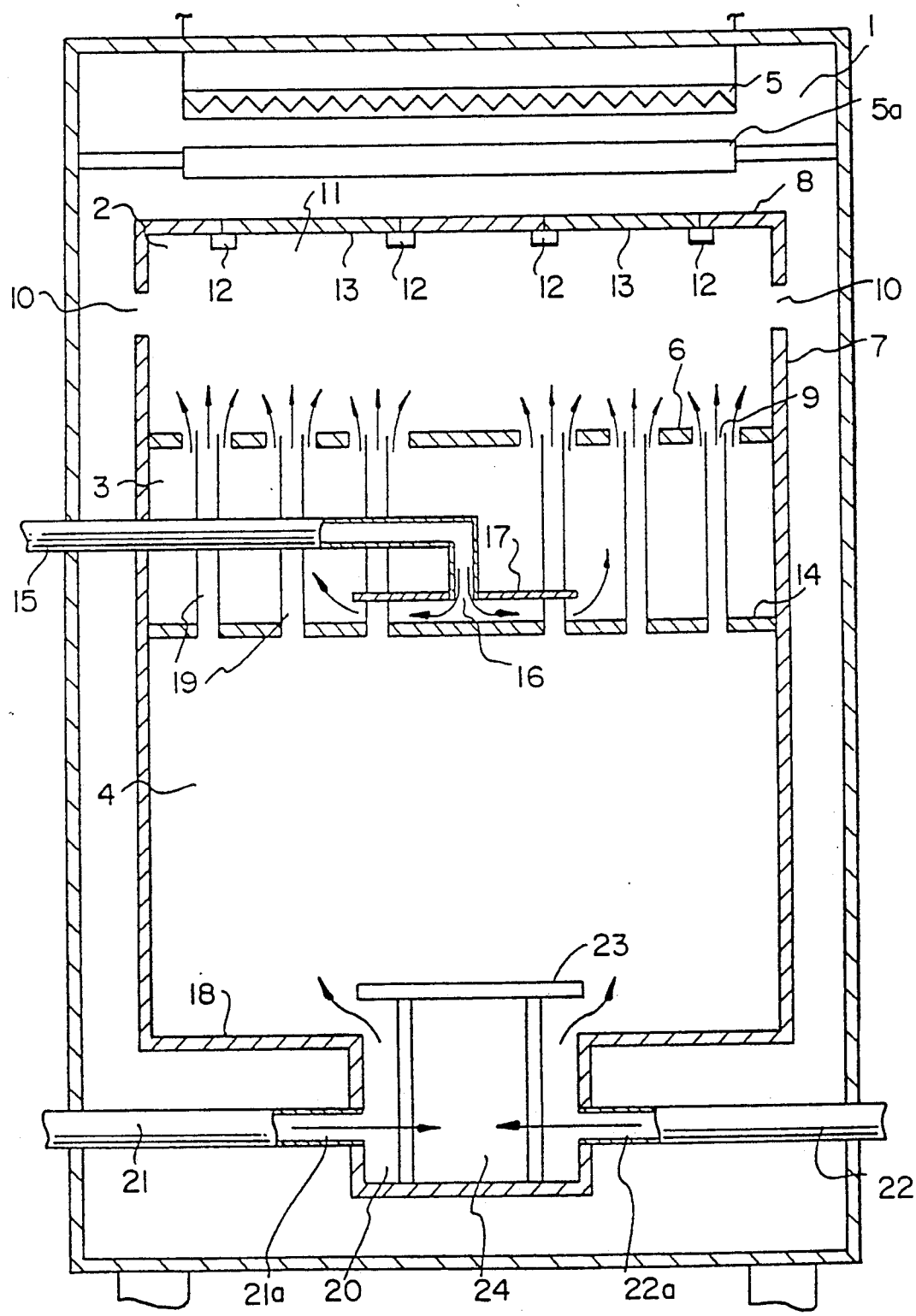

In an apparatus for producing semiconductors accoding to the present invention, a reactant gas dispersing chamber is newly provided at the lower part of a reaction chamber, a first reactant gas feeding pipe is extended into said reactant gas dispersing chamber and an end opening thereof is faced toward the bottom surface of said reactant gas dispersing chamber and a collar portion is formed in parallel around the periphery of the end opening. Therefore, a first reactant gas, such as AsH$_3$, blows off into the reactant gas dispersing chamber having a gas dispersing effect downwardly, and then comes in contact with a collar portion, extends in parallel and in all direction along the collar portion to disperse homogeneously in said reactant gas dispersing chamber, and then is supplied to the reaction chamber via communication holes disposed at the border between the reactant gas dispersing chamber and the reaction chamber. So that reactant gas is supplied to the reaction chamber in a uniform molecular beam state. That is, in the apparatus for producing semiconductors, by operations of a downward opening of the first reactant gas feeding pipe, a collar portion disposed at the circumference of said opening, a reactant gas dispersing effect of the reactant gas dispersing chamber, and a plurality of communicating holes disposed in the whole surface at predetermined intervals at a border portion between the reactant gas dispersing chamber and the reaction chamber, a Group V reactant gas such as AsH$_3$ is supplied to the reaction chamber in a uniform molecular beam state.

Second reactant gas such as TEAl and the like and third reactant gas such as TEGa and the like are mixed in a second dispersing chamber disposed under the reactant gas dispersing chamber, and the mixture is homogeneously supplied into said reaction chamber via the communicating pipes. In this case, a recess is formed at the bottom of the second dispersing chamber and an obstructing plate is disposed about above an opening of said recess to form a space made by the recess and the obstructing plate as a third dispersing chamber. Said second reactant gas feeding pipe and the third reactant gas feeding pipe are disposed at the surrounding walls of the third dispersing chamber in a state that openings of those pipes face each other. When second and third reactant gas are supplied to said second dispersing chamber from the clearance between the obstructing plate of said second dispersing chamber and opening of said recess after blowing off both second and third gases from said both openings of each feeding pipe and the mixing, mixing of both gases are well-done. When cuttings of which the diameter is almost the same as that of substrates are formed at the ceiling portion of said reaction chamber and substrate holding pieces are disposed at peripheral portion of the cuttings which face to the reaction chamber at predetermined interval along the circumference of the cuttings, almost whole part of the substrate surface can be utilized to form semiconductor layer because the hidden part of the substrate by the substrate holding piece is remarkably reduced in comparison with a case that the holding part is disposed at whole part of cutting circumference.

Following examples will illustrate the invention in detail.

Figure 1B:
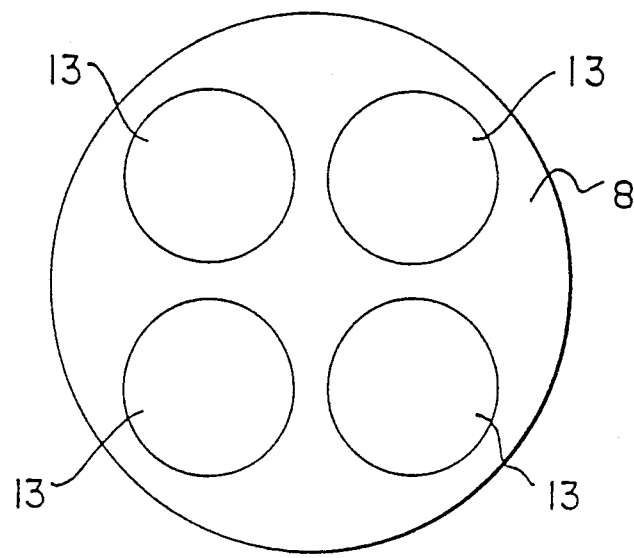
Figure 1C:
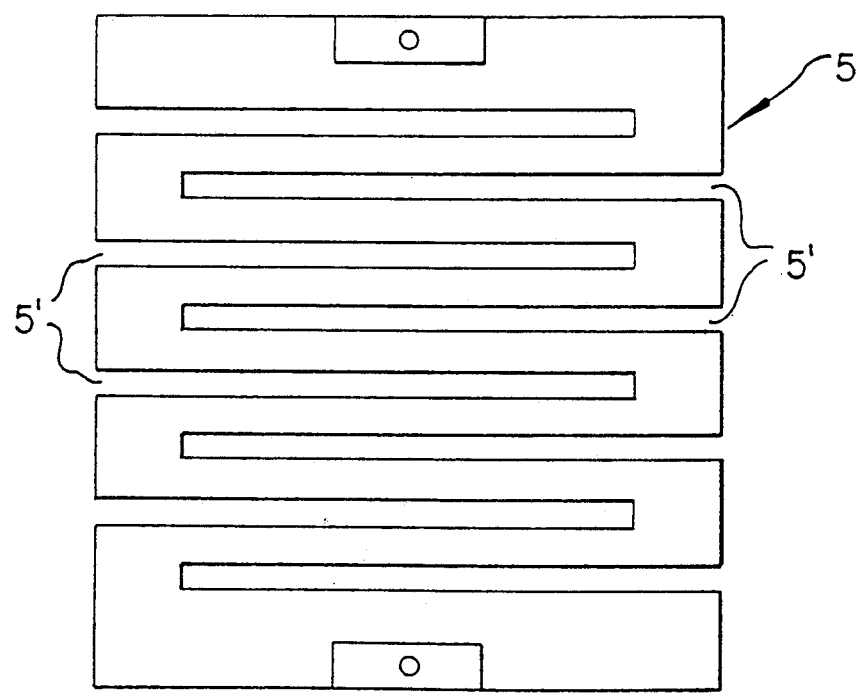
Figure 2:
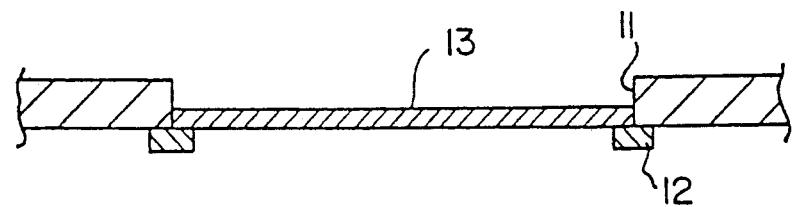
Figure 3:
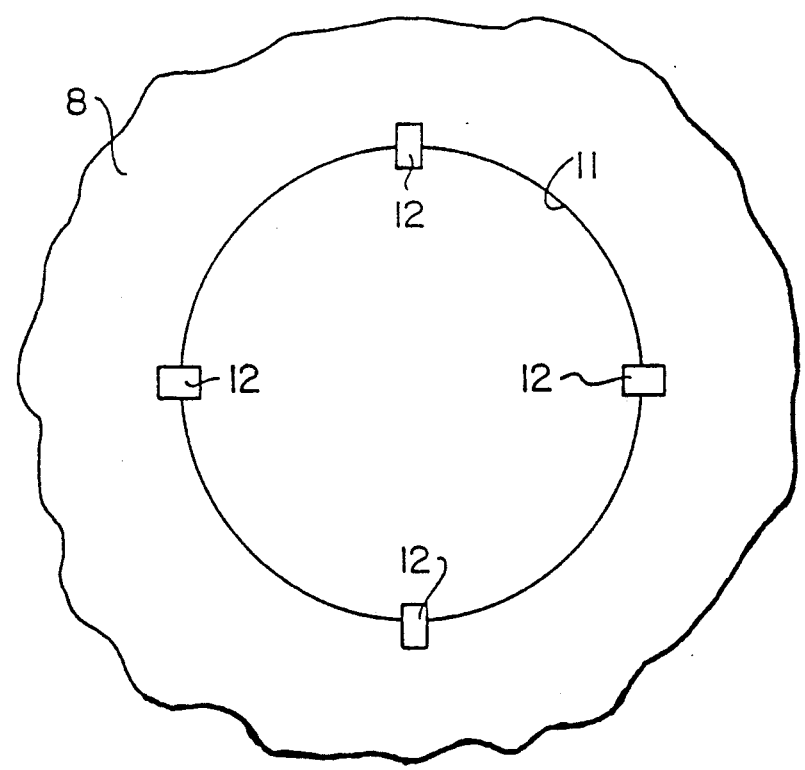

(A), (B) and (C) of FIG. 1 illustrate structure of an embodiment of the present invention. In FIG. (A), the reference numeral 1 indicates a cylindrical vacuum chamber made of stainless steel of vacuum chemical epitaxy system, the inside thereof is evacuated by vacuum exhaustion system (not shown in the figure) disposed at the bottom side of the vacuum chamber. In this vacuum chamber 1, a carbon graphite reaction chamber 2 of which the wall surfaces are coated with silicon carbide, a reactant gas dispersing chamber 3 made of carbon graphite as well as said reaction chamber 2, and a second dispersing chamber 4 made of stainless steel are integrally disposed. The reaction chamber 2 is constructed by a base plate 6, a surrounding wall 7 and a ceiling plate 8. The wall surface of the reaction chamber 2 is made of carbon graphite so that the wall surface becomes hot wall by heating with a heater 5 to reflect molecular grain without adhering thereto even if molecular beam of the reactant gas collide to the wall surface. A plurality of communicating holes 9 are formed in said base plate 6 at predetermined intervals. The reaction chamber 2 and the reactant gas dispersing chamber 3 thereunder are thereby communicated each other. An exhaust port 10 is formed at the upper part of said surrounding wall 7 along its circumference in a linear state. Four round cuttings 11 are formed in said ceiling plate 8 as shown in FIG. 1(B). Substrate supporting pieces 12 are protruded at the lower peripheral portion of each cutting 11 at ¼ intervals in a circumferential direction as shown in FIGS. 2 and 3. The substrate holding part comprises the four substrate supporting pieces 12. Round substrates 13 are placed replaciably on said cuttings 11 and supported by said substrate supporting pieces 12.

Said reactant gas dispersing chamber 3 disposed under the reaction chamber 2 comprises a base plate, a surrounding wall and a ceiling plate which is a base plate 6 of the reaction chamber 2, and wall surface of thereof is considered to be a hot wall as well as said reaction chamber. A first reactant gas feeding pipe 15 is extended into the reactant gas dispersing chamber 3 from outside, the end part thereof is bent downwardly and an opening 16 thereof opens downwardly. A discform collar portion 17 si formed at the peripheral portion of the opening 16 in parallel. The first reactant gas discharged from said opening 16 is thereby dispersed homogeniously in parallel and all directions along the collar portion 17. A second dispersing chamber 4 is formed under the reactant gas dispersing chamber 3.

Said second dispersing chamber comprises a base plate 18, a surrounding wall 7 and a ceiling plate which is the base plate 14 of the reactant gas dispersing chamber 3, and is made of stainless steel because it is less necessary to make the wall surface a hot wall. A plurality of communicating tubes 19 made of stainless steel are extended from the ceiling plate of the dispersing chamber 4 toward a plurality of communicating holes 9 formed on the ceiling plate 6 of the reactant gas dispersing chamber 3 respectively. In this case, a clearance is made between said communication tube 19 and and holl wall of the communication hole 9 to which the communicating tube 19 is extended. The second dispersing chamber 4 and the reaction chamber 2 is communicated by said communicating tube 19 and the reactant gas dispersing chamber 3 and reaction chamber 2 are communicated with the clearances between the communicating tubes 19 and the hole walls of the communicating holes 9. A recess 20 is formed at the central portion of the bottom of said second dispersing chamber 4. End openings 21a and 22a of first and second feeding pipes 21, 22 open at opposite sides of surrounding wall portions in a state both openings face each other. An obstructing plate 23 is disposed a little over the recess 20 in a state that the plate 23 faces the opening of thereof. A third dispersing chamber 24 is formed by the obstructing plate 23 and said recess 20. Said second and third reactant gases are homogeneously mixed by operations of their blowing off pressure and the obstructing plate 23 in the third dispersing chamber 24 and the mixture enters into said second dispersing clamber 4 through said clearance between the obstructing plate 23 and said opening of the recess. Then said mixed gas reached the reaction chamber 2 through said communicating tubes 19 after being further mixed homogeneously in the second dispersing chamber 4.

In FIG. 1(A), a reference numeral 5 indicates a plate type heater and 5a indicates a levelling plate. The temperature is set so that semiconductor compound can grow on the surface of the substrate 13 by heating mainly with radiant heat from the above. Said heater 5 is constructed by forming alternate stripe-form cuttings 5' on carbon graphite plate and disposing electrodes on both ends. While uniform planar heating is possible with such heater 5 alone, the use of the heat leveling plate 5a disposed below the heater 5 can make the planar heating more uniform.

In operation for MESFET epitaxy layer growth, the reaction chamber 2 is fitted with the substrates 13 (the surfaces face below respectively.) thereon. Then the vacuum chamber 2 is evacuated to a high vacuum state and the heater 5 is electrically loaded so that the heater 5 can generate heat. A Group V compound, such as $AsH_3$ is fed to the gas dispersing chamber 3 through the first reactant gas feeding pipe 15 with the substrate temperature at about 500° C. to make a homogeneous dispersing state therein. Then it is fed into the reaction chamber 2 through communicating holes 9 formed in the surface of the reactant gas dispersing chamber at uniform intervals. In the reaction chamber 2, such as $AsH_3$ flows toward exhaust ports which is disposed in a linear state in the surface of surrounding wall of the reaction chamber 2 along the circumference dispersedly contacting the surfaces of the substrates 13. During the flow, $AsH_3$ and the like is thermally cracked to give $As_2$. Thereafter, a Group III compound such as TEGa is fed into the third dispersing chamber 24 from the seconds reactant gas supplying tube 21 after the temperature of the substrates reaches a predetermined temperature (600°~650° C.) and at the same time the Group III compound, triethylaluminum (TEAl) is fed in the the third dispersing chamber 24 and mixed with the former reactant gas. The mixture is fed into a second dispersing chamber 4 and it, together with As₂, comes into contact with the surface of the substrates and grows on said surface in the form of an undoped gallium arsenide (GaAs) layer or the like. The unconsumed compound that has not come into contact with the substrates 13 leave the reaction chamber via the exhaust ports 10 and leave under the action of an exhaustion means. In this case, since the exhaust port 10 is formed in a linear state in the surrounding wall of the reaction chamber 2 along the circumference, the exhaustion of the unconsumed gas is conducted through all circumference of the surrounding wall to thereby contribute to a homogeneous dispersion of the reactant gas in the reaction chamber. Then, an n-type dopant, either alone or in admixture with the above-mentioned Group III or V compound, is fed to the reaction chamber 2 from the second dispersing chamber 4 so that an n-type active layer can grow on the surface of said undoped GaAs layer. Thereafter, all the gas supplies are discontinued and the system is maintained for a predetermined time as it is and the substrates 13 are cooled and then taken out of the reaction chamber 2. Thus, semiconductors having a uniform MESFET semiconductor layer can be obtained.

In this way, according to the embodiment, since the rection chamber 2 of which the capacity is smaller than the vacuum chamber 1 is disposed in the vacuum chamber 1 and the substrates are placed in the reaction chamber and in that state the reactant gas is supplied in a molecular beam state to let it grow, there is little gas in vain and utilization efficiently of the reactant gas is improved largely. In this apparatus, the vacuum chamber 1 can be evacuated to a high degree, the Group III compound of which the evaporation pressure is low can be used by gasifying as it is. Therefore, carrier gas for carrying the compound is not necessary, so that exhaustion treatment of gas after use becomes small. Particularly in said apparatus, since the reactant gas dispersing chamber 3 is newly disposed, the first reactant gas supplying tube 15 is disposed downwardly, and the end opening 16 thereof has a color portion 17, the reactant gas therein is in a homogeneously dispersted state. Therefore, the reactant gas is supplied into the reaction chabmer 2 in a homogeneous state, so that formation of a homogeneous semiconductor layer can be carried out on big substrate and a plurality of substrates without lotating the substrate or suceptor. In said embodiment, four substrates 13 are used, but the number of the substrate is not limited to this, either single or plural is all right.

Figure 4:
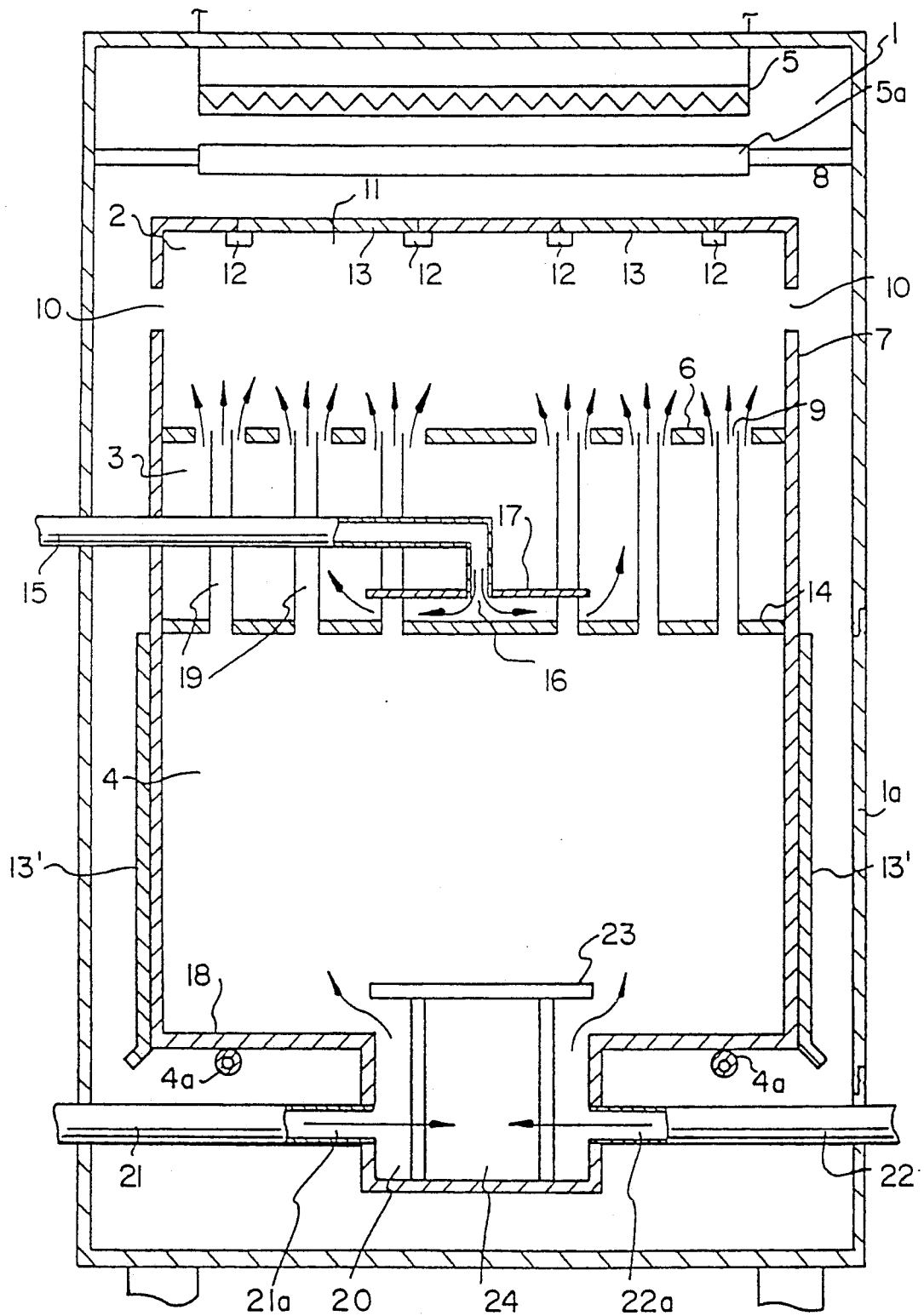
Figure 5:
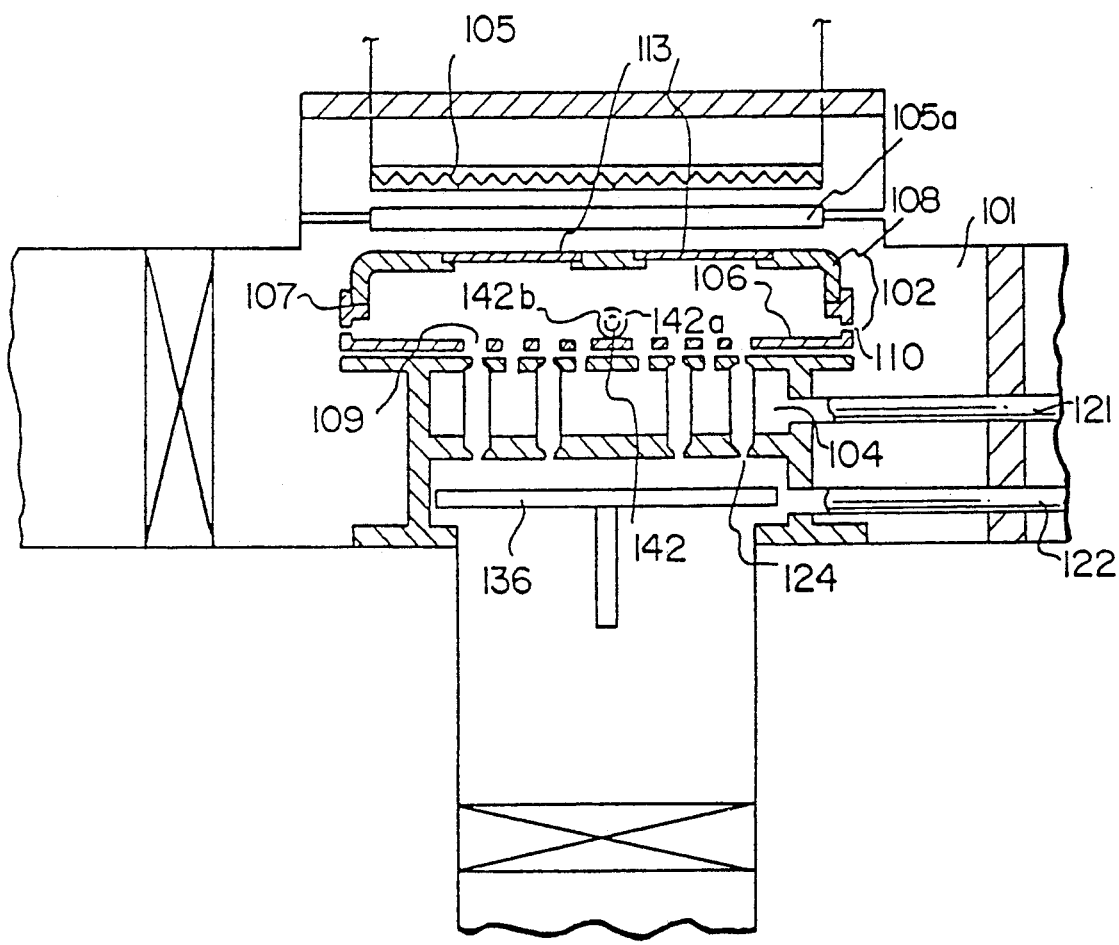
Figure 6:
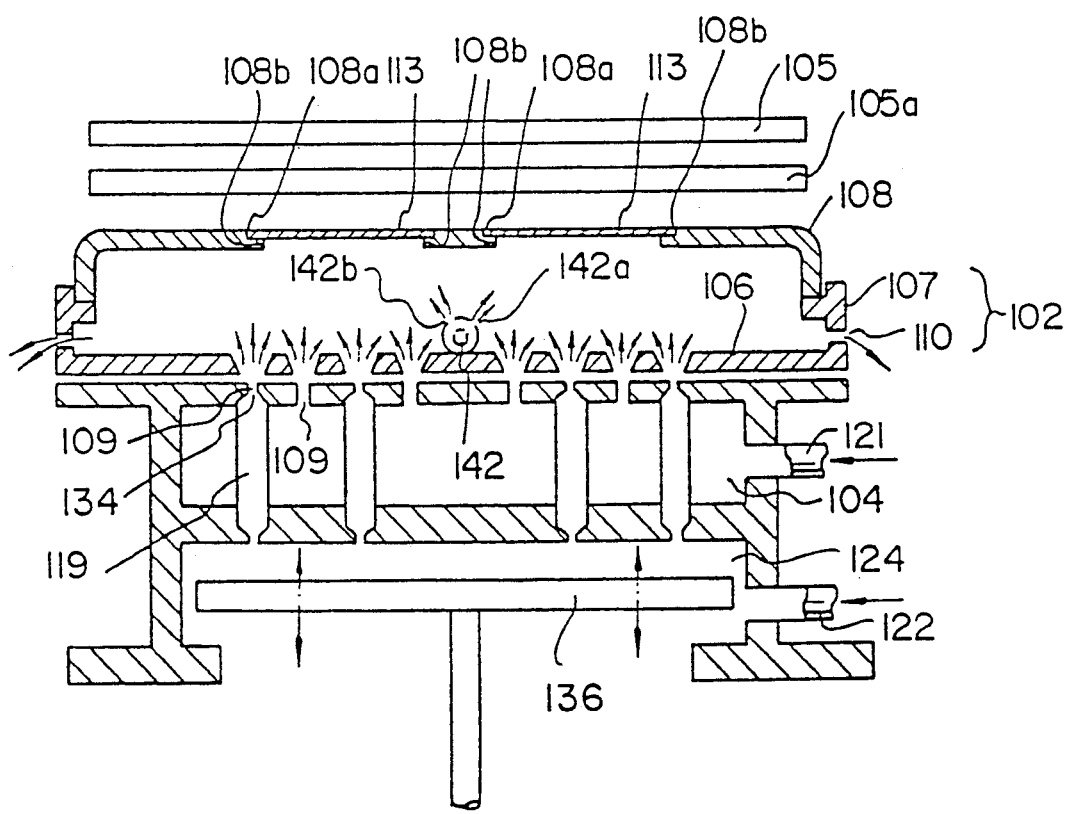
Figure 7:
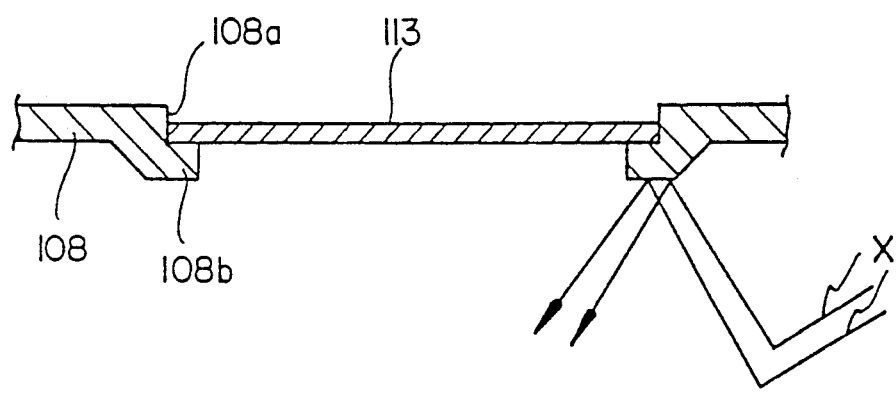
Figure 8:
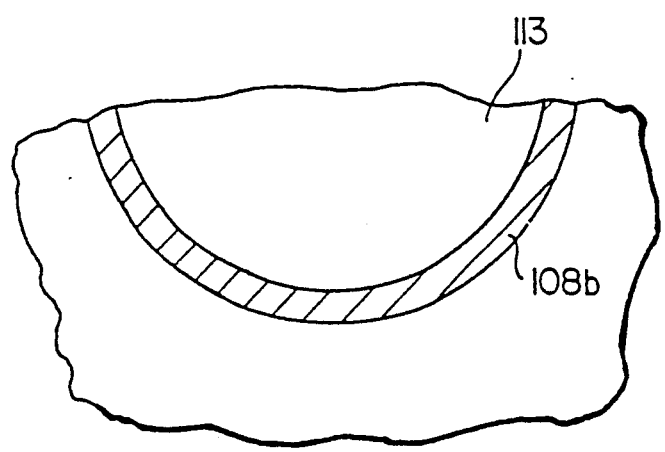

FIG. 4 shows another embodiment. In this embodiment, foil 13′ made of metal such as stainless steel and the like is disposed cylindrically at the circumference of a second dispersing chamber 4 made of cheap stainless steel and fixed removably with a bis and the like. Lower portion of said cylindrically disposed the foil ′ is formed skirt-like. The reference numeral 1 indicates a lid portion disposed at the part of the vacuum chamber 1 for disposing said foil 13′. The numeral 4a indicates a cooling pipe made of stainless steel for cooling said dispersing chamber 4. Otherwise is same as FIG. 1(A).

As a result of thus constructed, since unconsumed reaction product which leaves from the reaction chamber 2 when forming semiconductor layer is adhered to the surface of cylindrical foil′, other parts in the vacuum chamber 1 is prevented pollution in a wide range. That is, since the temperature of the second dispersing chamber is rather lower than that of the reaction chamber 2, the unconsumed reactive material is adhered preferentially to said part of which the temperature is low. Therefore, the circumference of the dispersing chamber 4 is prevented from the pollution by said cylindrical foil 13′.

What is claimed is:

1. A process of producing semi-conductors which comprises suspending a substrate from the ceiling of a reaction chamber; downwardly feeding a first reactant gas into a first dispersing chamber disposed below said reaction chamber, and laterally dispersing said first reactant gas in said first chamber; upwardly feeding at least a second reactant gas into a second dispersing chamber disposed below said first dispersing chamber, and laterally dispersing said second reactant gas in said second chamber; passing said dispersed second reactant gas upwardly through conduit means disposed in said first dispersing chamber, and passing said second reactant gas directly from said conduit means upwardly into said reaction chamber; passing said dispersed first reactant gas upwardly from said first dispersing chamber around said conduit means and into said reaction chamber substantially surrounding said second reactant gas; and maintaining said reaction chamber under conditions of pressure and temperature sufficient to cause said reactant gases to react and to thereby form a compound semiconductor on a surface of said substrate disposed toward said reaction chamber.

2. The process as claimed in claim 1 including highly evacuating said reaction chamber and heating and maintaining said substrate at a minimum of about 500° C., after said substrate is suspended from said ceiling of said reaction chamber and before said first reactant gas is fed into said first dispersing chamber.

3. The process as claimed in claim 1 including feeding a third reactant gas to said second reactant gas in said second dispensing chamber; admixing said second and third reactant gases; laterally dispersing said admixture, and feeding said dispersed admixture into said reaction chamber.

4. The process as claimed in claim 1 including pulling a vacuum on said reaction chamber sufficient to cause said dispersed reactants to flow from said dispersing chambers to said reaction chamber.

5. The process as claimed in claim 1 wherein said first reaction gas is a compound of a Group V element.

6. The process as claimed in claim 1 wherein said second reactant gas is a compound of a Group III element.

* * * * *

UNITED STATES PATENT AND TRADEMARK OFFICE
CERTIFICATE OF CORRECTION

PATENT NO. : 5,118,642

DATED : June 2, 1992

INVENTOR(S) : YOSHINO et al

It is certified that error appears in the above-identified patent and that said Letters Patent is hereby corrected as shown below:

Column 1, line 6, "relate" should read --relates--; and delete "an apparatus" and substitute therefor --a method--.

Column 2, line 55, after "material" insert --inlet--.

Column 3, line 43, after "substrate" insert --holding--.
line 60, delete "ga" and substitute therefor --gas--.

Column 4, line 8, "illustrate" should read --illustrates--.

Column 5, line 63, delete "si" and substitute therefor --is--.

Column 5, line 57, after "surface" delete "of".

Column 6, line 11, after 19, delete "and".

Column 7, line 51, after "big" insert --area--;
line 61, "'" should read --13'--.

UNITED STATES PATENT AND TRADEMARK OFFICE
CERTIFICATE OF CORRECTION

PATENT NO. : 5,118,642
DATED : June 2, 1992
INVENTOR(S) : YOSHINO et al

It is certified that error appears in the above-indentified patent and that said Letters Patent is hereby corrected as shown below:

Column 8, line 8, "'" should read --13'--.

Signed and Sealed this

Fourteenth Day of December, 1993

Attest:

BRUCE LEHMAN

Attesting Officer    Commissioner of Patents and Trademarks